United States Patent
Singerl et al.

(10) Patent No.: US 8,971,398 B2
(45) Date of Patent: Mar. 3, 2015

(54) SYSTEM AND METHOD FOR GENERATING A RADIO FREQUENCY PULSE-WIDTH MODULATED SIGNAL

(75) Inventors: Peter Singerl, Villach (AT); Christian Schuberth, Villach-Landskron (AT); Martin Mataln, Villach (AT); Franz Dielacher, Villach (AT)

(73) Assignee: Infineon Technologies AG, Neubiberg (DE)

( * ) Notice: Subject to any disclaimer, the term of this patent is extended or adjusted under 35 U.S.C. 154(b) by 301 days.

(21) Appl. No.: 13/236,385

(22) Filed: Sep. 19, 2011

(65) Prior Publication Data

US 2013/0070836 A1 Mar. 21, 2013

(51) Int. Cl.
| | |
|---|---|
| H03K 7/08 | (2006.01) |
| H03K 9/08 | (2006.01) |
| H03F 3/217 | (2006.01) |
| H03F 1/02 | (2006.01) |
| H03F 3/60 | (2006.01) |

(52) U.S. Cl.
CPC ............ *H03F 3/2178* (2013.01); *H03F 1/0277* (2013.01); *H03F 3/602* (2013.01)
USPC ........... 375/238; 375/296; 375/295; 345/690; 345/691; 332/109

(58) Field of Classification Search
USPC .................. 375/238, 296, 295; 345/690, 691; 332/109
See application file for complete search history.

(56) References Cited

U.S. PATENT DOCUMENTS

| | | | |
|---|---|---|---|
| 4,780,685 A | 10/1988 | Ferguson | |
| 5,148,168 A | 9/1992 | Masuda et al. | |
| 5,256,987 A | 10/1993 | Kibayashi et al. | |
| 6,028,485 A | 2/2000 | Sigmon et al. | |
| 6,031,481 A | 2/2000 | Craven | |
| 6,473,457 B1 | 10/2002 | Pascual et al. | |
| 6,597,242 B2 | 7/2003 | Petz et al. | |

(Continued)

FOREIGN PATENT DOCUMENTS

| | | |
|---|---|---|
| CN | 101261292 A | 9/2008 |
| KR | 20090102412 A | 9/2009 |

(Continued)

OTHER PUBLICATIONS

Kimball, Donald F., et al., "High-Efficiency Envelope-Tracking W-CDMA Base-Station Amplifier Using GaN HFETs," IEEE Transactions on Microwave Theory and Techniques, vol. 54, No. 11, Nov. 2006, 9 pages.

(Continued)

*Primary Examiner* — Phuong Phu
(74) *Attorney, Agent, or Firm* — Slater & Matsil, L.L.P.

(57) ABSTRACT

In an embodiment, a method of producing a multi-level RF signal includes producing plurality of pulse-width modulated signals based on an input signal. The method further includes driving a corresponding plurality of parallel amplifiers with the plurality of pulse-width modulated signals by setting a parallel amplifier to have a first output impedance when a corresponding pulse-width modulated signal is in an active state and setting the parallel amplifier to have a second output impedance when the corresponding pulse-width is in an inactive state. The method also includes phase shifting the outputs of the plurality of parallel amplifiers, wherein phase shifting transforms the second output impedance into a third impedance that is higher than the second output impedance, and combining the phase shifted outputs.

32 Claims, 10 Drawing Sheets

(56) References Cited

U.S. PATENT DOCUMENTS

| | | | |
|---|---|---|---|
| 6,794,931 | B2 | 9/2004 | Kenington |
| 7,548,048 | B2 | 6/2009 | Chang |
| 7,843,242 | B1 * | 11/2010 | Zhao .......................... 327/175 |
| 8,344,823 | B2 * | 1/2013 | Bloy et al. .................. 333/101 |
| 2003/0210096 | A1 | 11/2003 | Pengelly et al. |
| 2006/0001484 | A1 | 1/2006 | Paul et al. |
| 2006/0286957 | A1 * | 12/2006 | Oishi .......................... 455/323 |
| 2009/0167431 | A1 | 7/2009 | Guilherme et al. |
| 2009/0270056 | A1 | 10/2009 | Singerl et al. |
| 2009/0273396 | A1 | 11/2009 | Nam et al. |
| 2010/0020108 | A1 * | 1/2010 | Cho et al. .................... 345/690 |
| 2010/0079206 | A1 | 4/2010 | Song et al. |
| 2010/0085097 | A1 | 4/2010 | Bryant |
| 2012/0256697 | A1 | 10/2012 | Singerl et al. |
| 2013/0016795 | A1 | 1/2013 | Kunihiro et al. |

FOREIGN PATENT DOCUMENTS

| | | |
|---|---|---|
| WO | WO 2011/034471 A1 | 3/2011 |
| WO | WO 2011/070952 A1 | 6/2011 |

OTHER PUBLICATIONS

Lee, Yong-Sub et al., "A High-Efficiency Class-E GaN HEMT Power Amplifier for WCDMA Applications," IEEE Microwave and Wireless Components Letters, vol. 17, No. 8, Aug. 2007, 3 pages.

Xu, Hongtao, et al., "A High-Efficiency Class-E GaN HEMT Power Amplifier at 1.9 GHz," IEEE Microwave and Wireless Components Letters, vol. 16, No. 1, Jan. 2006, 3 pages.

Gwee, B-H., et al., "A Micropower Low-Distortion Digital Class-D Amplifier Based on an Algorithmic Pulsewidth Modulator," IEEE Transactions on Circuits and Systems, Oct. 2005, pp. 2007-2022, vol. 52, No. 10.

Chi, S., et al., "The Frequency Spectrum of Polar Modulated PWM Signals and the Image Problem," ICECS, 2010, pp. 679-682, IEEE.

Amin, A.M.A., et al., "Exploring Aliasing Distortion Effects on Regularly-Sampled PWM Signals," 3rd IEEE Conference on Industrial Electronics and Applications, Jun. 3-5, 2008, pp. 2036-2041, Singapore.

Song, Z., et al., "The Frequency Spectrum of Pulse Width Modulated Signals," Jun. 2, 2003, pp. 1-39.

Guinee, R.A., "A Novel Fourier Series Simulation Tool for Pulsewidth Modulation (PWM) in Pulsed Power Systems," Conference Proceedings Applied Power Electronics Conference and Exposition, Feb. 15-19, 1998, pp. 123-128, vol. 1. Cork, Ireland.

Gustavsson, U., et al., "A General Method for Passband Quantization Noise Suppression in Pulsed Transmitter Architectures," IMS 2009, pp. 1529-1532, Stockholm, Sweden.

Santi, S., et al., "Spectral Aliasing Effects of PWM Signals with Time-Quantized Switching Instants," Proceedings of the 2004 International Symposium on Circuits and Systems, May 23-26, 2004, pp. IV-689-IV-692.

Wilkinson, Ernest J., "An N-Way Hybrid Power Divider," IRE Transactions on Microwave Theory and Techniques, pp. 116-118, Jun. 1959.

Chen, et al., "A Polar-Transmitter Architecture Using Multiphase Pulsewidth Modulation," IEEE Transactions on Circuits and Systems, vol. 58, No. 2, Feb. 2011, pp. 244-252.

Jeong, et al., "Pulsed Load Modulation (PLM) Technique for Efficient Power Amplification," IEEE Transactions on Circuits and Systems—II: Express Briefs, vol. 55, No. 10, Oct. 2008, pp. 1011-1015.

Liao, et al., "High Efficiency WCDMA Power Amplifier with Pulsed Load Modulation (PLM)," IEEE Journal of Solid-State Circuits, vol. 45, No. 10, Oct. 2010, pp. 2030-2037.

Zhang, et al., "Analysis of Power Recycling Techniques for RF and Microwave Outphasing Power Amplifiers," IEEE Transactions on Circuits and Systems—II: Analog and Digital Signal Processing, vol. 49, No. 5, May 2002, pp. 312-320.

Berkhout, M., et al., "Class-D Audio Amplifiers in Mobile Applications," IEEE Transactions on Circuits and Systems—I: Regular Papers, vol. 57, No. 5, May 2010, 11 pages.

Cambareri, V., "Generation and Characterization PWM Signal to Class-D Amplifiers High Efficiency," Thesis of Master Degree, University of Bologna, Academic Year 2010-2011, Session II, 53 pages.

Phanphaisam, W., et al., "A Simple Synthesis Technique of PWM Signal," IEEE Asia Pacific Conference on Circuits and Systems, APCCAS 2006, Dec. 4-7, 2006, pp. 1647-1650.

* cited by examiner

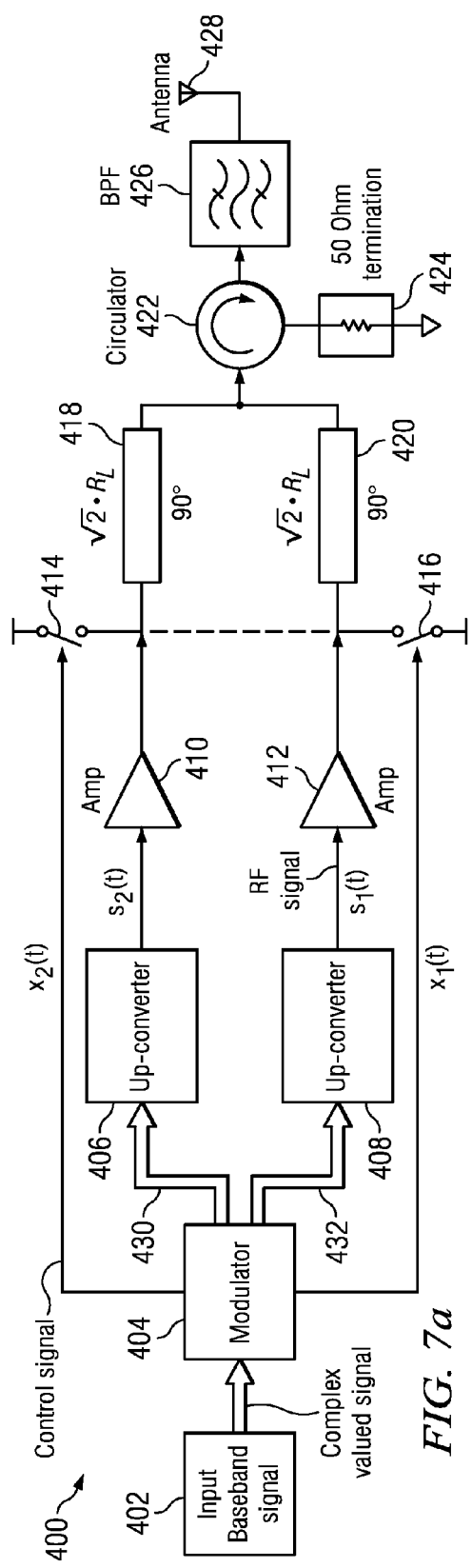
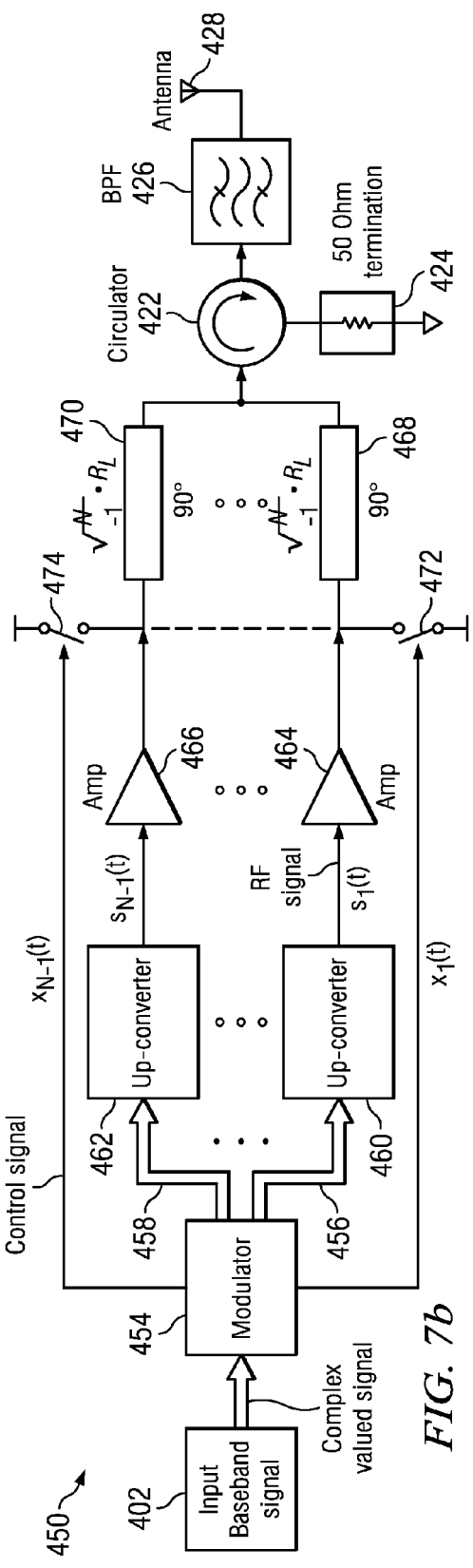
FIG. 7a
FIG. 7b

SYSTEM AND METHOD FOR GENERATING A RADIO FREQUENCY PULSE-WIDTH MODULATED SIGNAL

TECHNICAL FIELD

This invention relates generally to semiconductor circuits and methods, and more particularly to a system and method for generating a radio frequency pulse-width modulated signal.

BACKGROUND

Pulse-width modulated systems are used to provide high efficiency amplification and transmission in applications that vary widely from low-power consumer audio devices, such as MP3 players, to high power data transmission circuits such as base station transmitters. High efficiency is achieved by minimizing power losses due to bias current within the output stages of an amplifier. For example, in audio applications, a class-D amplifier is used to switch the terminals of a loudspeaker between two supply voltages at a frequency greater than the bandwidth of the desired output signal. Here, high frequency switching energy is filtered by the characteristics of the load circuit, for example, the inductance of the loudspeaker. Similarly, in RF applications, a power amplifier (PA), is driven by a pulse-width modulated signal with a pulse frequency greater than the bandwidth of interest. Out-of-band energy is then filtered using an RF bandpass filter, such as a SAW filter for low power applications or a cavity filter for high power applications. Because there is a minimal IR drop across the output stage of devices operating in a switched manner, as can be the case when PWM signals are used, dissipated power across the output stages of the devices are minimized and efficiency is improved.

The generation of high dynamic range PWM signals, however, poses a number of challenges at high frequencies and at radio frequencies (RF). As the bandwidths of broadband systems increase, there is a corresponding increase in the switching rate of the PWM signal used to drive the upconverter. Parasitic losses at these high switching rates, however, may lower the overall efficiency of the PWM system.

One way to reduce the switching rate in a PWM system is to use multiple parallel PWM signal levels to drive parallel RF power amplifiers. While the overall switching rate may be reduced, other inefficiencies arise such as power losses due to the loading of multiple stages, and losses due to reflected power at the bandpass filter.

SUMMARY OF THE INVENTION

In an embodiment, a method of producing a multi-level RF signal includes producing plurality of pulse-width modulated signals based on an input signal. The method further includes driving a corresponding plurality of parallel amplifiers with the plurality of pulse-width modulated signals by setting a parallel amplifier to have a first output impedance when a corresponding pulse-width modulated signal is in an active state and setting the parallel amplifier to have a second output impedance when the corresponding pulse-width is in an inactive state. The method also includes phase shifting the outputs of the plurality of parallel amplifiers, wherein phase shifting transforms the second output impedance into a third impedance that is higher than the second output impedance, and combining the phase shifted outputs.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 7a-b illustrate a multi-level RF transmission systems according to further embodiments;

DETAILED DESCRIPTION OF ILLUSTRATIVE EMBODIMENTS

Figure 1:
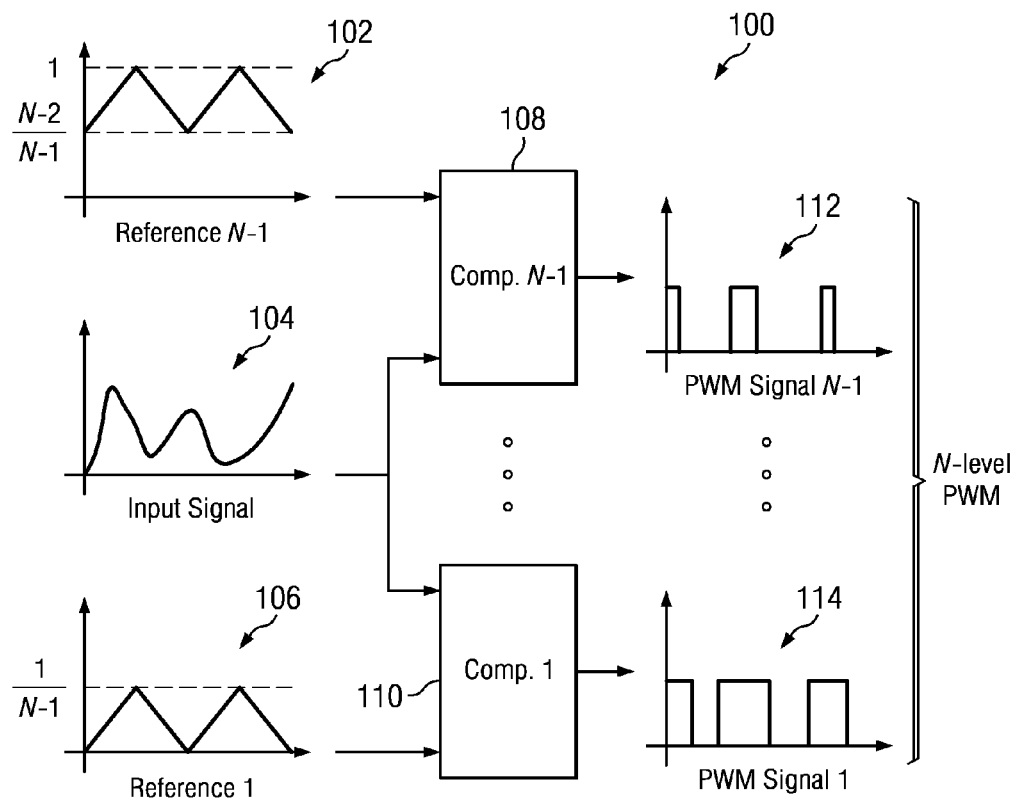
FIG. 1 illustrates a conventional multi-level PWM generator.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a pulse-width modulator and output stage for use with baseband and RF transmission systems. The invention may also be applied, however, to other types of circuits and systems, such as audio systems, communication systems, and other electronic or optical systems that utilize pulse-width modulated signals.

In an embodiment, a discrete-time pulse-width modulated signal is created by calculating a finite number of basis functions representing an output PWM signal. The band limited nature of these basis functions prevent aliasing due to the discrete time nature of the signal, thereby allowing for a high-dynamic range and a low out-of-band noise floor. The use of basis functions to generate pulse-width modulated signals to efficiently drive an amplifier (PA) is described in U.S. patent application Ser. No. 13/081,628 filed on Apr. 7, 2011 entitled "System and Method for Generating a Pulse-width Modulated Signal," which application is incorporated by reference herein in its entirety.

In some embodiments, the use of basis functions to create a pulse-width modulated signal is extended to create a multi-level RF signal using multiple basis function derived pulse-width modulated signals. These multiple pulse-width modulated signals are each used to drive an array of power amplifiers whose outputs are combined to form a single output. At this output, each of the pulse-width modulated signals combine to form a multi-level output. In some embodiments, these pulse-width modulated signals are upconverted before driving the power amplifiers. Reflected power is avoided by phase shifting each output of each power amplifier before the outputs are combined, and passing the phase shifted combined output though a circulator or other isolation device.

One of the main issues with using a pulse width modulated signal in an RF system is the large spectral out-of-band components located near the desired signal band. In many cases, these close in out-of-band components are filtered out prior to the signal being fed to an antenna, cable or other device in order to meet the out-of-band spectral requirements of the particular system. Filtering these out-of-band components, however, may significantly reduce the efficiency of the PA if the reflected out-off band components from the filter are dissipated in an isolator or other device.

One way in which efficiency may be maintained is if the coding efficiency, defined as the ratio of in band power to total power, is increased. One way in which the coding efficiency can be increased is by using multiple switched-mode power amplifiers (SMPAs) in which two or more PAs are driven with individual PWM signals. The PA output ports are connected together with a power combiner prior the signal being fed to an isolator and filter. This concept works well as long as the PWM frequency is kept within the range of a few MHz or lower. In the future, however, high-bandwidth base station applications may require bandwidths of 100 MHz and above. The efficiency of these high bandwidths systems may be lower due to high PWM frequencies needed to maintain high linearity. These high PWM frequencies are generally difficult to handle on the PA side because of the required high bandwidth matching networks and the increased parasitic losses in the transistors itself.

Another issue relates to base stations operating in a duplex mode in which the receive band is quite close to the transmit band. To avoid high interference between the transmit and receive signal paths, a sufficiently high PWM frequency is used. In some proposed embodiments, a PWM coding method is used in combination with a power combiner network that reduces the PWM frequency, relaxes the bandwidth requirements on each individual PA, yet maintains a high enough switching rate at the filter input to ensure high future bandwidth and efficiency requirements.

FIG. 1 illustrates a conventional system 100 for generating a multi-level PWM signal. Here, the incoming envelope of a complex modulated signal 104 is separated in the amplitude domain by N−1 amplitude and phase shifted triangular reference functions 102 and 106. Comparators 108 and 110 compare a respective reference function with the input signal 104 and generate PWM respective PWM signals 112 and 114. While only two reference functions 102 and 106 and two comparators 108 and 110 are illustrated for simplicity of illustration, any number of comparators may be used depending on the particular application and its specifications.

Figure 2:
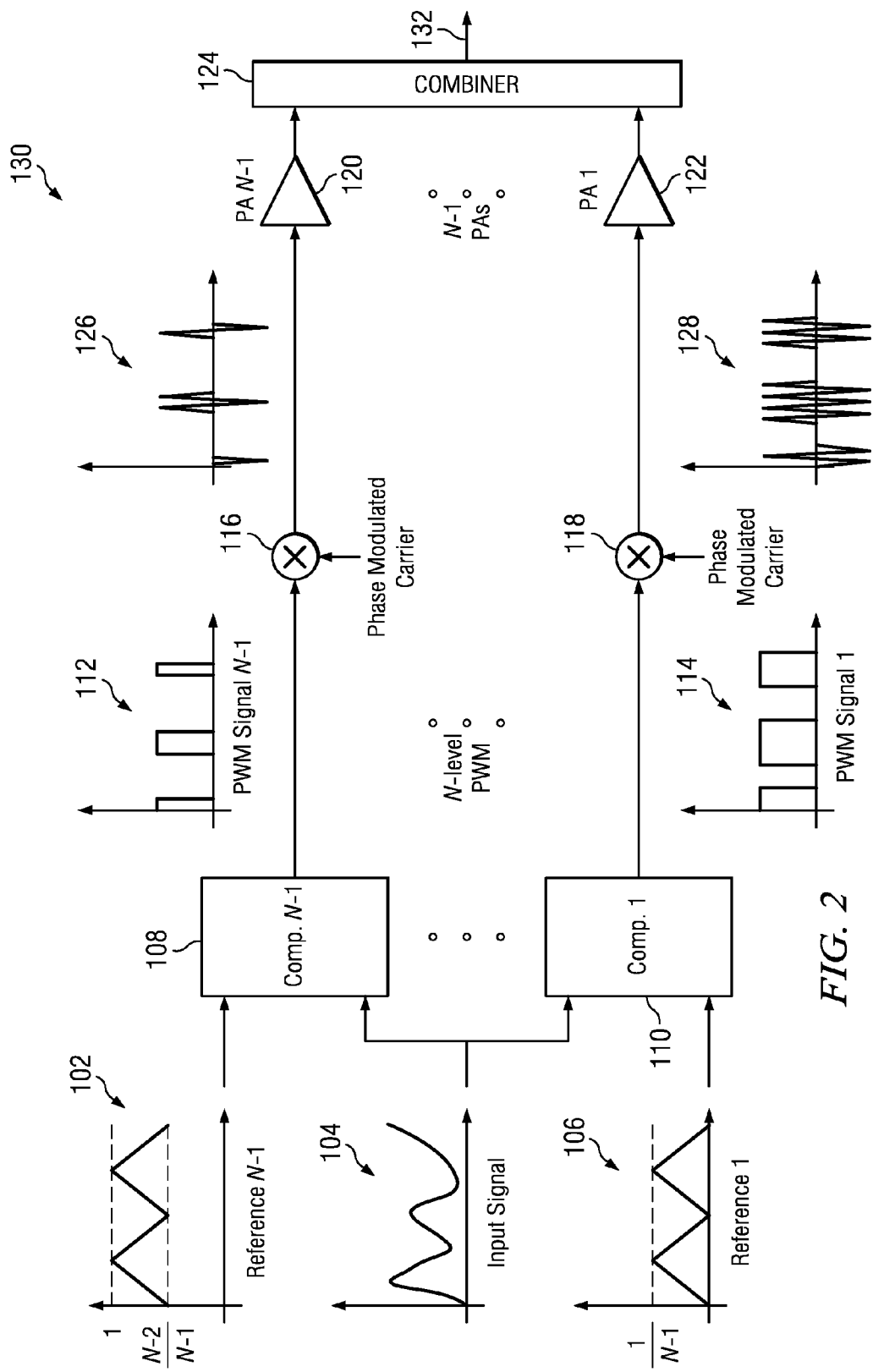
FIG. 2 illustrates an embodiment multi-level RF transmitter.

FIG. 2 illustrates an embodiment multi-level PWM system 130 adapted for producing a multi-level RF output. In an embodiment, N−1 individual PWM baseband signals generated by comparators 108 and 110 are upconverted by mixers 116 and 118, respectively, to form upconverted signals 126 and 128, which are then amplified by PAs 120 and 122. Two PAs 120 and 122 are shown for simplicity of illustration; however, more PAs may be used to amplify N−1 upconverted PWM signals. The outputs of PAs 120 and 122 are combined by combiner 124 to form N-level multi-level RF output signal 132. In some embodiments, high efficiency is achieved by driving PAs 120 and 122 in a highly efficient manner, for example, at a high signal level. In an embodiment, PAs 120 and 122 are driven into 1 dB compression to get a high peak efficiency. Alternatively, the PA's may be driven at other levels. The resulting combined output 132 is an N-Level PWM signal.

After the amplification, individual RF-bursts (PA output signals) are combined together by combiner 124 to build N-level PWM signal 132. It should be appreciated that as the number of PWM levels increases, the out-off band spectral energy of N-level PWM signal 132 decreases. This increases the overall efficiency of the transmitter for complex modulated signals with high peak to average power ratios (PAPR) even if an isolator is used in front of the required bandpass filter.

In an embodiment, the total signal (PWM) is amplified efficiently because PA 120 and 122 are either in an off state or completely on. However, PWM signal 132 is filtered using, for example, a bandpass filter before the antenna to reconstruct or demodulate the original modulated signal. In order to reconstruct the original modulated signal, out-of-band spectral components are filtered out. These filtered components are reflected by the bandpass filter input and travel back to an isolator between the combiner and the bandpass filter, where they are dissipated. This dissipation causes a decrease in efficiency. Using a higher coding efficiency reduces out-of-band power, thereby reducing this efficiency degradation. A higher efficiency is, therefore, achieved.

Figure 3:
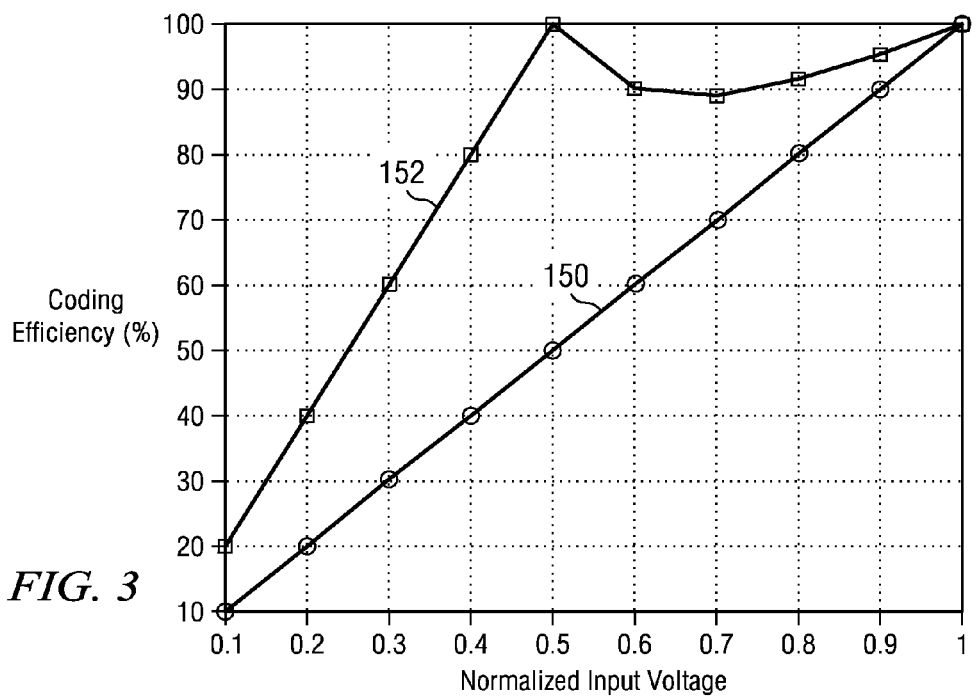
FIG. 3 illustrates a graph of coding efficiency for embodiment PWM generators.

FIG. 3 illustrates a graph of the coding efficiency of signals produced by the system illustrated in FIG. 2. Curve 150 represents the coding efficiency of a two-level PWM scheme using a single PA, and curve 152 represents a three level PWM scheme using two PA. As can be seen, coding efficiency for a two level PWM 150 decreases linearly with lower input voltage (input signal in FIG. 2), while the coding efficiency for the three level PWM 152 stays high down to the half of the maximum input voltage. This increase in coding efficiency also leads to an improvement in the electrical efficiency for modulated signals with high PAPR. As the number of PWM levels is increased beyond the three levels, as shown in FIGS. 1 and 2, the coding efficiency and, hence, the electrical efficiency can be further improved by using more hardware.

The architecture in FIG. 2 works effectively for lower signal bandwidths, for example, below 20 MHz. At higher signal bandwidths, such as 75 MHz and above, the required relative bandwidth for the input matching networks of PAs 120 and 122 shown in FIG. 2 are close to or even higher than one. This required relative bandwidth may be defined, in some embodiments, as:

$$Bs \times L \times Nh,$$

where Bs is the signal bandwidth, L is a factor relating to required in band signal quality (linearity), and Nh is the number harmonics needed for high efficiency PA operation. In one embodiment, L=6 and Nh=4. These values are estimated numbers that depend on the particular application. Other values may be used for L and Nh depending on the particular system and its specifications.

Figure 4:
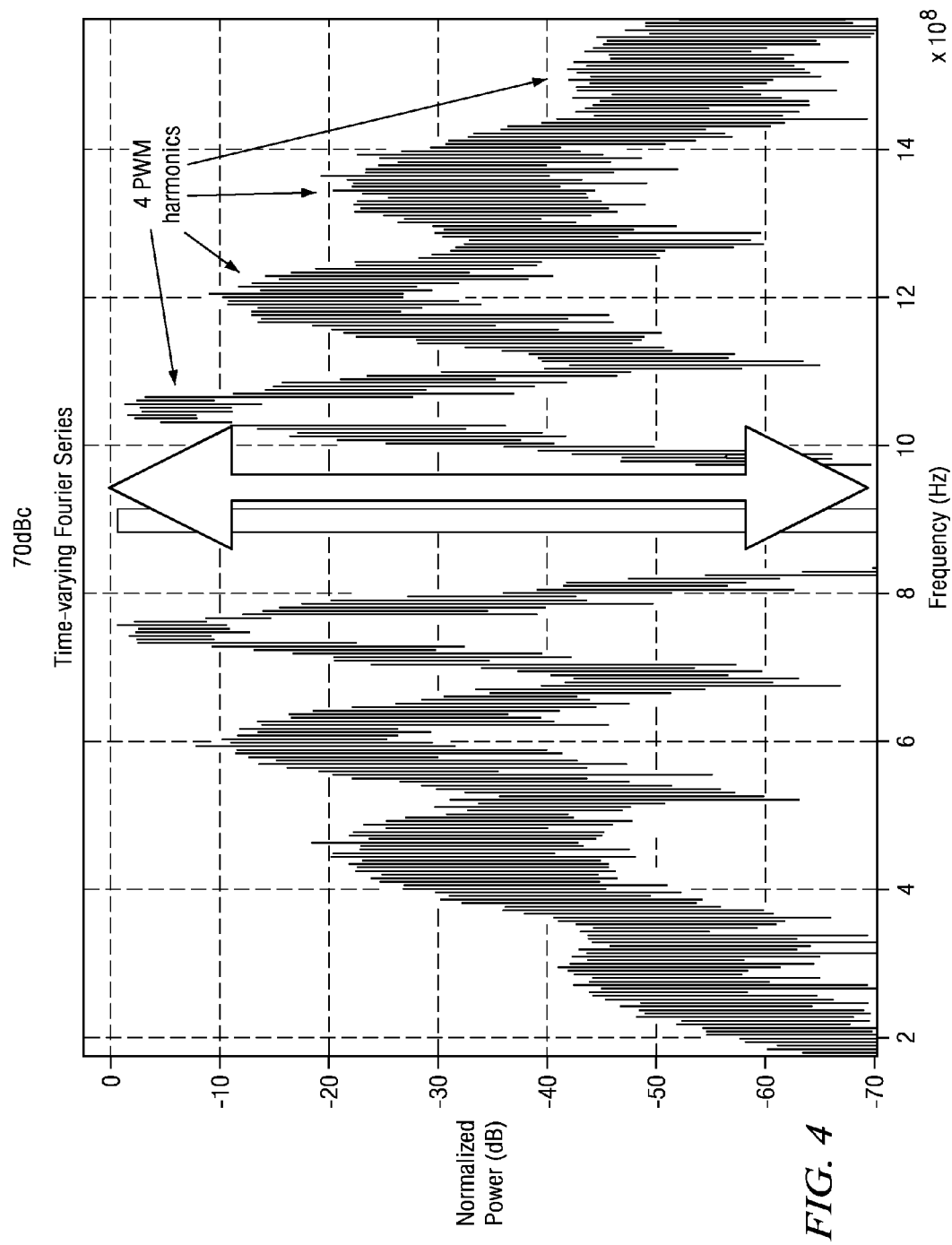
FIG. 4 illustrates an embodiment modulated PWM output spectrum.

FIG. 4 depicts a spectral plot for a 3-level PWM signal having a 900 MHz carrier frequency, a 35 MHz signal bandwidth and four harmonics. To obtain 70 dBc input signal dynamic range, a PWM reference frequency of about 150 MHz is needed. This is difficult to implement using state of the art technologies because a high bandwidth, for example (4×2×150) MHz=1200 MHz, for the PAs, would be needed. This high bandwidth is difficult to match at the 1 GHz or 2

GHz carrier frequencies used for radio base station applications because the relative bandwidth is too high.

Figure 5:
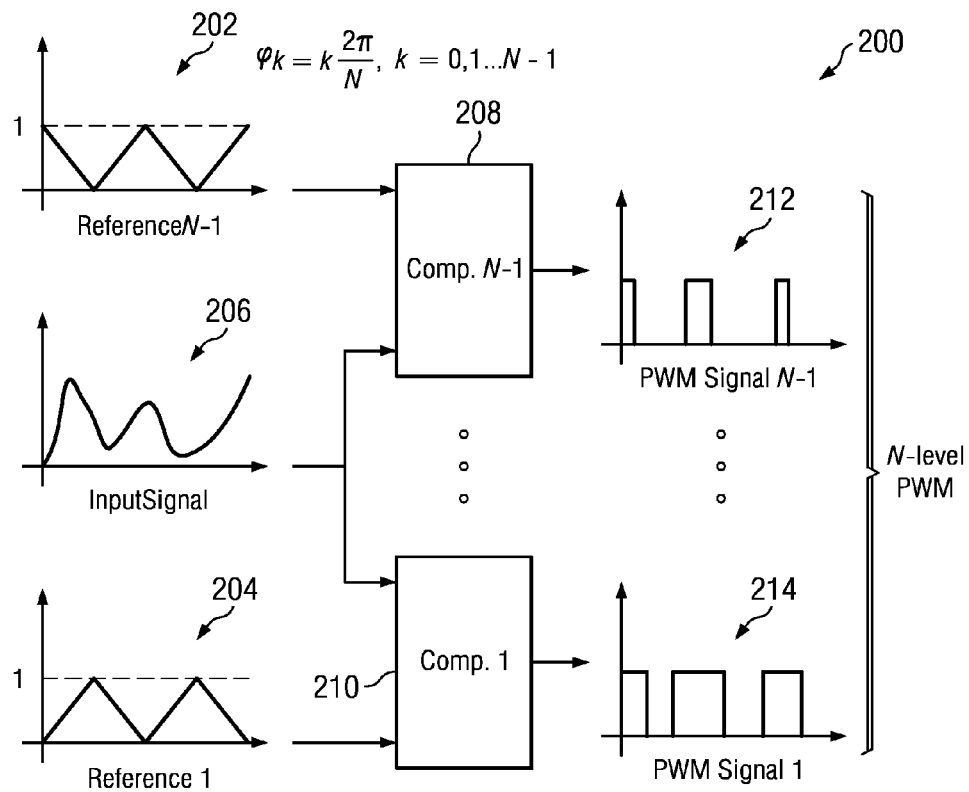
FIG. 5 illustrates an embodiment multi-level PWM generator using phase shifted reference functions.

FIG. 5 illustrates multi-level PWM transmitter 200 according to a further embodiment of the present invention. In contrast to the system of FIGS. 2 and 3, the multi-level PWM signal here is generated with phase shifted reference functions 202 and 204 that are phase shifted with respect to each other, but have an equal amplitude level. Reference functions 202 and 204 are compared to input signal 206 using comparators 208 and 210 to produce PWM signals 212 and 214, respectively. It should be appreciated that, while only two reference functions, comparators and PWM signals are shown for simplicity of illustration, any number of reference functions, comparators and PWM signals may be used in other embodiments.

It is important to note that the PWM generation is not limited by the system illustrated in FIG. 5. The PWM generation can also be performed using basis functions described in U.S. patent application Ser. No. 13/081,628. For example, in an embodiment, a band limited kernel or basis function can be derived natural-sampling trailing-edge PWMs for input signals x(t) bounded between 0 and 1. The continuous time input-output relationship of such a PWM signal can be written as:

$$y(t) = f\{x(t)\}$$

$$= x(t) + \sum_{k=1}^{\infty} \frac{1}{k\pi} (\sin(2\pi k f_p t) - \sin(2\pi k f_p t - 2\pi k x(t))),$$

where x(t) is the input signal, $f_p$ is the PWM frequency, and y(t) is the pulse-width modulated output signal. From the above equation, it is apparent that the kernel is not band-limited, since y(t) has frequency components approaching infinity when x(t) is non-zero.

The above expression can be expressed in a discrete-time or sampled version where x(nT) is substituted for x(t):

$$y(nT) = f\{x(nT)\}$$

$$= x(nT) + \sum_{k=1}^{\infty} \frac{1}{k\pi} (\sin(2\pi k f_p nT) - \sin(2\pi k f_p nT - 2\pi k x(nT))),$$

where T is the sampling period. In the above equation, aliasing occurs for T>0. Therefore, in some embodiments, the kernel is band-limited by using only k terms instead of all terms:

$$y(nT) = f_{BL}\{x(nT)\}$$

$$= x(nT) + \sum_{k=1}^{K} \frac{1}{k\pi} (\sin(2\pi k f_p nT) - \sin(2\pi k f_p nT - 2\pi k x(nT))).$$

Therefore, for a sufficiently short sampling period T, the aliasing problem is avoided. In embodiments, the PWM signal is generated based on the band-limited kernel from the last equation, where each harmonic k is calculated according to:

$$g_k\{\ \} = \frac{1}{k\pi} (\sin(2\pi k f_p nT) - \sin(2\pi k f_p nT - 2\pi k x(nT))).$$

One difference between the multi-level PWM generation system illustrated in FIG. 1 and the multi-level PWM generation system illustrated in FIG. 5, is that the PWM generation system of FIG. 1 produces a thermometer coded output, while the system of FIG. 5 does not. In a system having a thermometer coded output, comparators used to detect higher signal levels are only switched on if comparators used to detect lower signal levels are already active. This is not the case in the PWM scheme shown in FIG. 5. Here, each comparator may be switched on independent of the detection state of other comparators. By allowing for independent comparator switching, the effective switching rate of the composite output PWM signal is N times the switching rate of the individual comparator and PA.

Figure 6A:
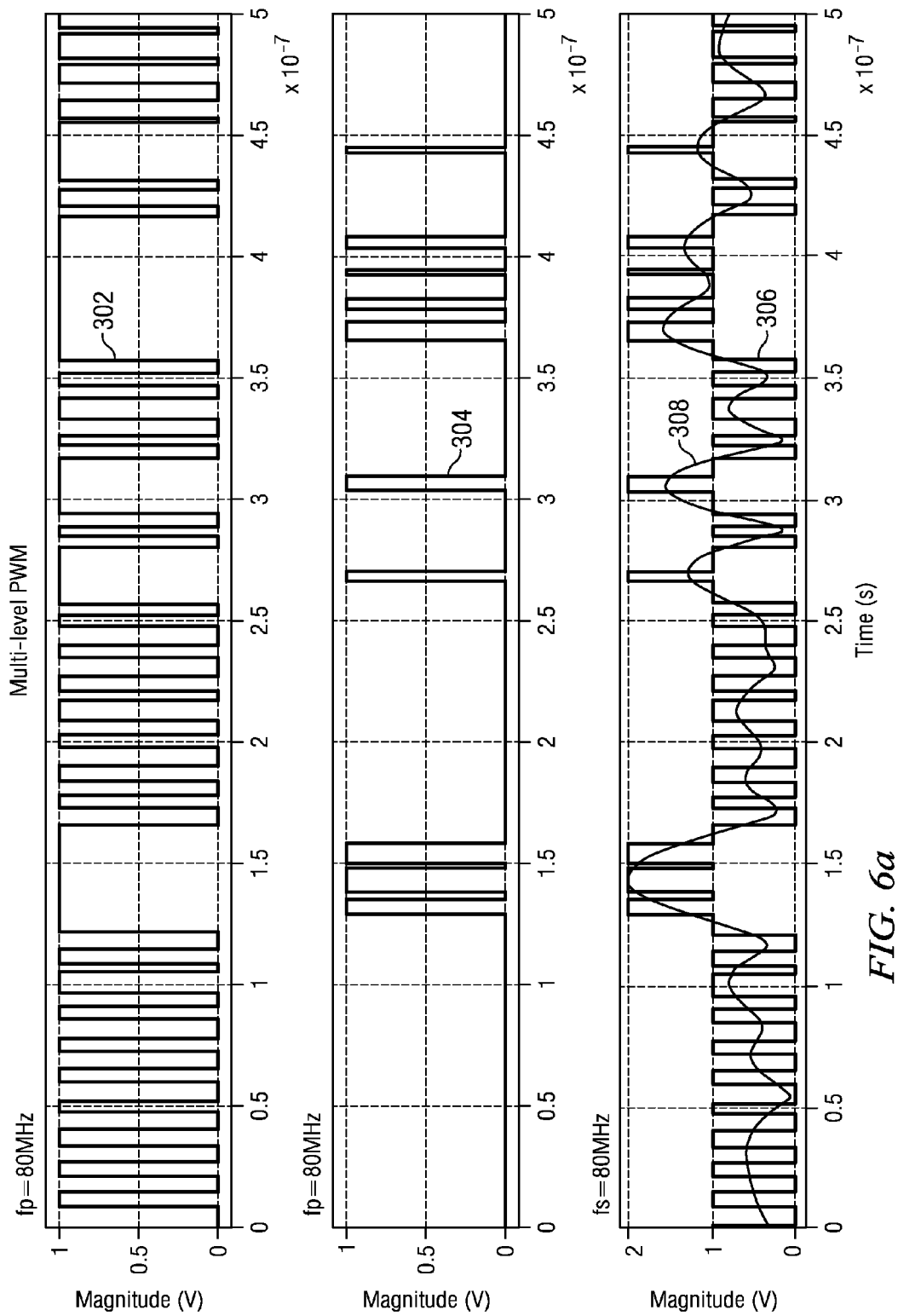
FIGS. 6a-c illustrates waveforms of embodiment PWM generators.
Figure 6B:
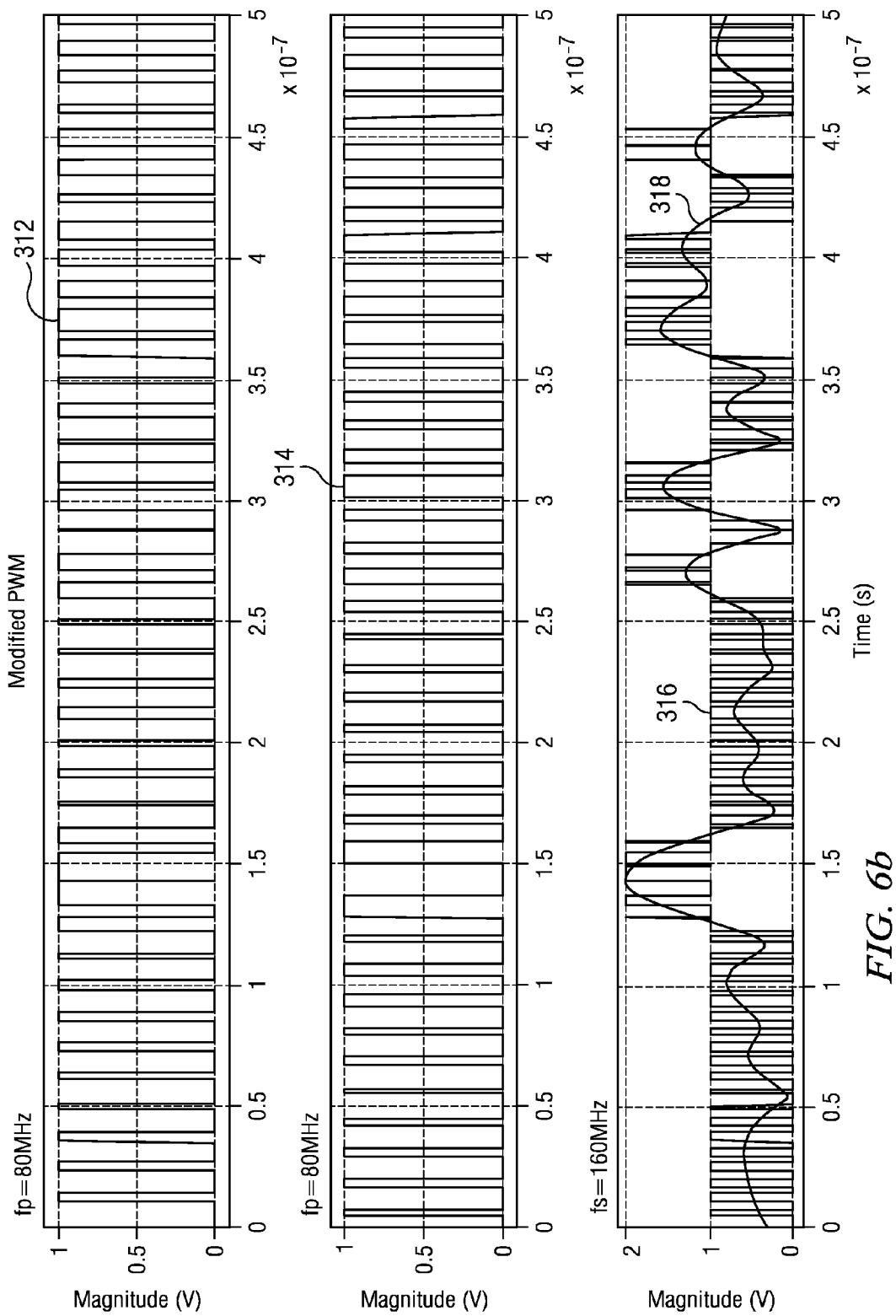

FIGS. 6a and 6b illustrate waveform diagrams illustrating the time domain performance of thermometer coded multi-level PWM generation and non-thermometer coded multi-level PWM generation. FIG. 6a illustrates waveforms generated by the system of FIG. 1 that uses amplitude separated reference functions. Curves 302 and 304 represent the comparator outputs, curve 306 represents the combined multi-level PWM signal, and curve 308 represents the filtered PWM output signal. FIG. 6b illustrates waveforms generated by the system of FIG. 5 that uses phase shifted reference functions. Curves 312 and 314 represent the comparator outputs, curve 316 represents the combined multi-level PWM signal, and curve 318 represents the filtered PWM output signal.

It can be seen that, in the amplitude separated reference function system of FIG. 1, curve 304 is high only if curve 302 is high, whereas, in the phase separated reference function system of FIG. 5, curves 312 and 314 are active independently to each other. Furthermore, it can be seen that multi-level PWM signal 306 (N=3) generated by the amplitude separated reference function system of FIG. 1 has an effective switching rate of the switching rate used to generate the PWM signal (i.e. 80 MHz). On the other hand, multi-level PWM signal 316 (N=3) generated by the phase shifted reference function system of FIG. 5 has an effective switching rate of twice the switching rate used to generate the PWM signal (i.e. 160 MHz). In some embodiments, this higher effective switching rate is double the switching rate of the individuals PAs.

Figure 6C:
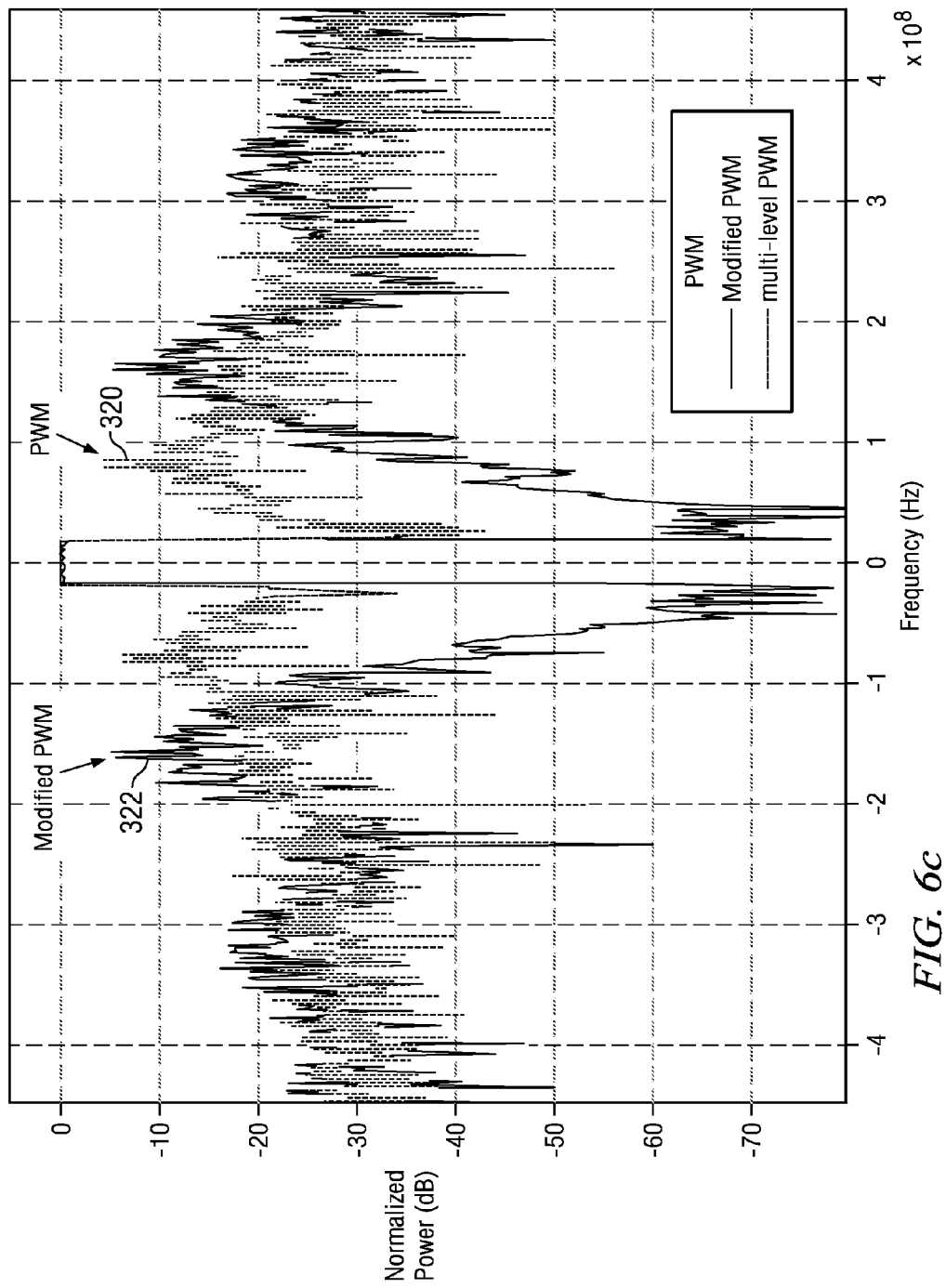

In an embodiment, this higher effective switching rate also results in a PWM spectrum where the first harmonics are shifted away from the desired signal band at two times the PWM switching frequency without requiring a doubling of the PA matching network bandwidth. This spectral behavior is illustrated in FIG. 6c for a system having a 35 MHz signal bandwidth and 80 MHz PWM reference frequency. Curve 320 represents the output spectrum of a system using amplitude separated reference functions, for example the system of FIG. 1. Curve 322 represents the output spectrum of a system using phase shifted reference functions, for example the system of FIG. 5. As shown, the amplitude separated reference function system achieves about a 30 dBc in-band dynamic range, while the phase shifted reference function system achieves about a 60 dBc in-band dynamic range. It should be appreciated that this example is just an illustration of one embodiment system comparison. Actual performance may vary according to the particular embodiment and its implementation.

While it is possible to improve the dynamic range by using phase shifted basis reference functions to increase the effective output PWM switching rate, RF combiner structures, such as the Doherty combiner, poses some issues with the combining the individual modulated PWM signals to form a final multi-level RF signals. In the particular situation where PWM signal 212 is active, but PWM signal 214 is inactive, the Doherty loses efficiency because PA 122 is switched off and the high impedance of PA 122 is transformed via the 90 degree transmission line of the Doherty combiner to a short on the combiner output. This prevents RF power from flowing from upper PA 120 to the load, which considerably degrades the efficiency of the system.

FIG. 7a illustrates multi-level RF system 400 according to an embodiment of the present invention. Multi-level RF system 400 has a modulator 404 that generates a plurality of PWM signals 430 and 432 from input baseband signal 402. In some embodiments, modulator 404 uses phase shifted reference functions of the same amplitude to generate PWM signals 430 and 432, and operates according to systems and method discussed in described in U.S. patent application Ser. No. 13/081,628. PWM signals 430 and 432 are upconverted by upconverters 406 and 408, respectively, the outputs of which are amplified by PAs 410 and 412. The outputs of PAs 410 and 412 are combined by a network having 90 degree phase shifters 418 and 420, and switches 414 and 416 that couple the output of PAs 410 and 412 to a RF ground. In an embodiment, 90 degree phase shifters 418 and 420 are implemented by quarter-wavelength transmission lines having an impedance of $\sqrt{2}R_L$, where $R_L$ is the output impedance of the PAs. In the embodiment of FIG. 7a, $R_L$ is about 50 Ohms. Alternatively, other impedances can be used. The outputs of phase shifters 418 and 420 are coupled to an input port of circulator 422, which is terminated by termination 424. Bandpass filter 426 is coupled between the output port of circulator 422 and antenna 428. Alternatively, an isolator or other device that decouples PAs 410 and 412 from bandpass filter 426 may be used.

In system 400, PAs 410 and 412 may be in one of the four states 00,01,10,11. If both PAs are off (00), no output power is delivered to the antenna and no DC power is needed for this operation, thereby providing for efficient operation. If both PAs are on (11) or in an active state, the combiner operates as a Wilkinson combiner that combines the output power of the two PAs without losses (ideal case). If only one of the PA is on and the other is off (01,10), the "off" path is decoupled from the "on" path. This can be accomplished with the switches 414 and 416 using a switching rate equal to the PWM reference frequency. For example, if PA 410 is in the "off" state, and its output current is zero (infinite impedance), and switch 414 is coupled between the input of phase shifter 418 to an RF ground. Phase shifter/transmission line 418 transforms the RF ground to an open circuit at the output of phase shifter/transmission line 418. Likewise, when PA 412 is in an "off" state, switch 416 is coupled between the output of PA 412 to an RF ground, which is transformed to an open circuit by phase shifter/transmission line 420. The decoupling effect of the transformed open circuits helps maintain efficiency operation for the states 01 and 10. The system shown in FIG. 7 is not limited to creating a three level signal, and may be extended to N levels as described in embodiments above. Switches 414 and 416 may be implemented, for example, using discrete devices such as Shottky diodes, LDMOS transistors, GaN transistors, using integrated solutions in the transistor package of the PA, or even on chip.

In an embodiment, system 400 may be extended to have an arbitrary number of baseband PWM signals, upconverters, PAs, switches and phase shifters depending on how many RF output amplitude levels are desired. FIG. 7b illustrates embodiment multi-level RFs system 450 that is configured to transmit N output levels. Here, modulator 454 outputs N−1 output channels 456 to 458 to N−1 upconverters 460 to 462 to produce upconverted signals $s_1(t)$ to $s_{N-1}(t)$. N−1 PAs 464 to 466 amplify upconverted signals $s_1(t)$ to $s_{N-1}(t)$, the outputs of which are combined by N−1 90 degree phase shifters 468 to 470. N−1 switches 472 to 474 selectively couple the outputs of PAs 464 to 466 to RF ground. In an embodiment, 90 degree phase shifters 468 to 470 have an impedance of about $\sqrt{N-1}\cdot R_L$, and may be implemented using quarter-wavelength transmission lines. Operation of phase shifters 468 to 470 with respect to switches 472 to 474 proceeds as described with respect to the embodiment of FIG. 7a. In an embodiment, amplifiers that are not transmitting have their outputs coupled to ground via their corresponding switch. For example, if PA 466 is not transmitting, switch 474 is closed. The resulting RF ground is then transformed to an RF open at the output of 90 degree phase shifter 470.

Figure 8:
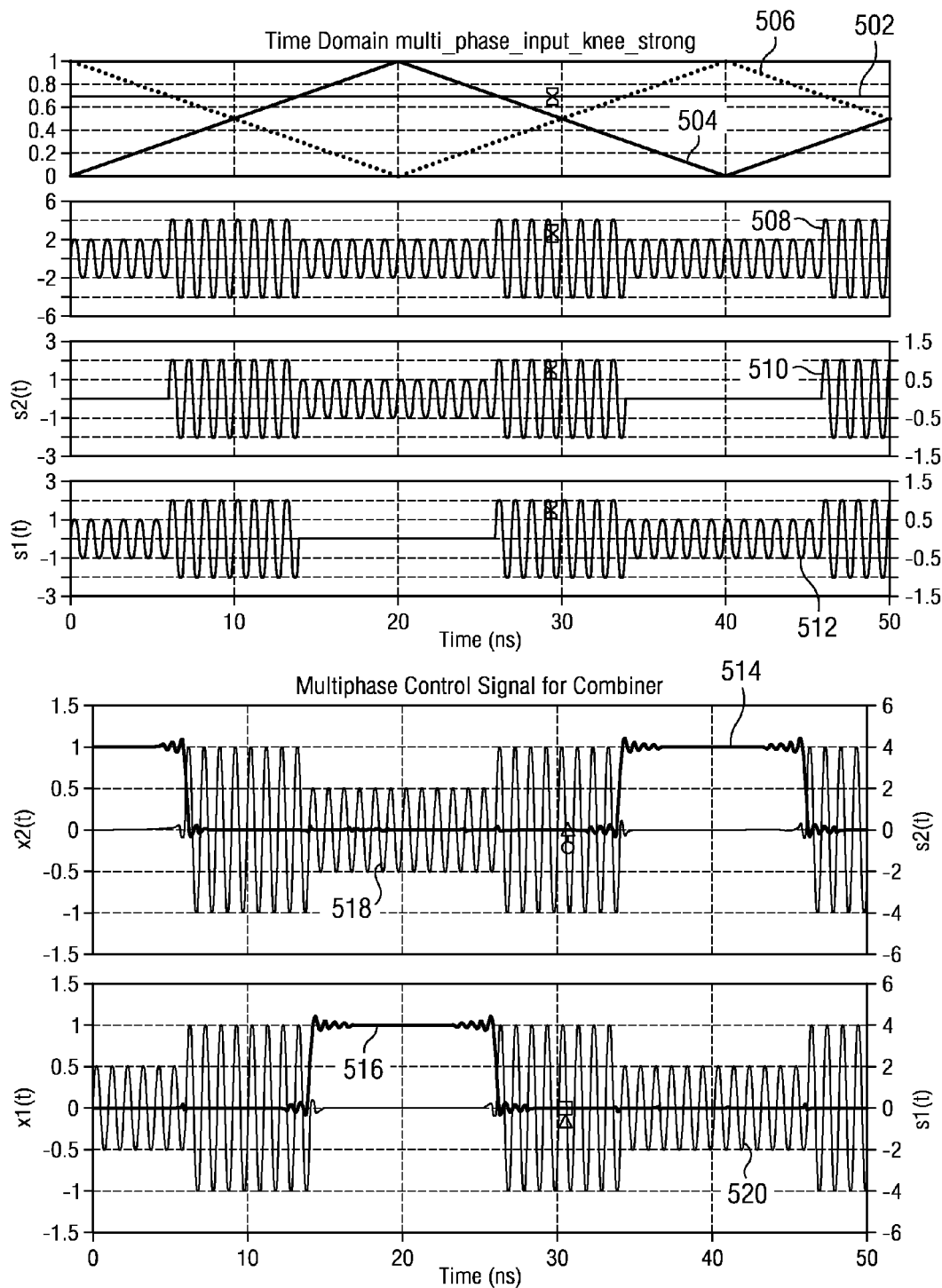
FIG. 8 illustrates a waveform diagram of an embodiment multi-level RF transmission system.

FIG. 8 illustrates waveform diagrams associated with system 400 of FIG. 7. Curve 502 represents the input baseband signal, curves 504 and 506 represent phase shifted reference signals used in the modulator 404, curve 508 represents the combined multi-level RF output. Curves 510 and 512 represent the input of PAs 410 and 412, respectively, and curves 518 and 520 illustrate the output of PAs 410 and 412, respectively. The switch control signals for PAs 410 and 412 are 514 and 516, respectively. In an embodiment, the system has a constant input signal of 0.7 times the maximum duty cycle (Umax) of baseband input signal (FIG. 7). Umax may also be defined, for example, as the normalized maximum input magnitude to the modulator 404 (FIG. 7), where the maximum input magnitude is normalized to 1. If only one of PAs 410 and 412 is active, the corresponding driving signal (510 or 512) is halved to avoid a strong compression within the PA, because the PAs sees twice the optimum load impedance in these conditions. In an embodiment, if only one PA is active, the modulator generates half of the maximum PWM signal magnitude compared to the case if both PAs are active.

Figure 9:
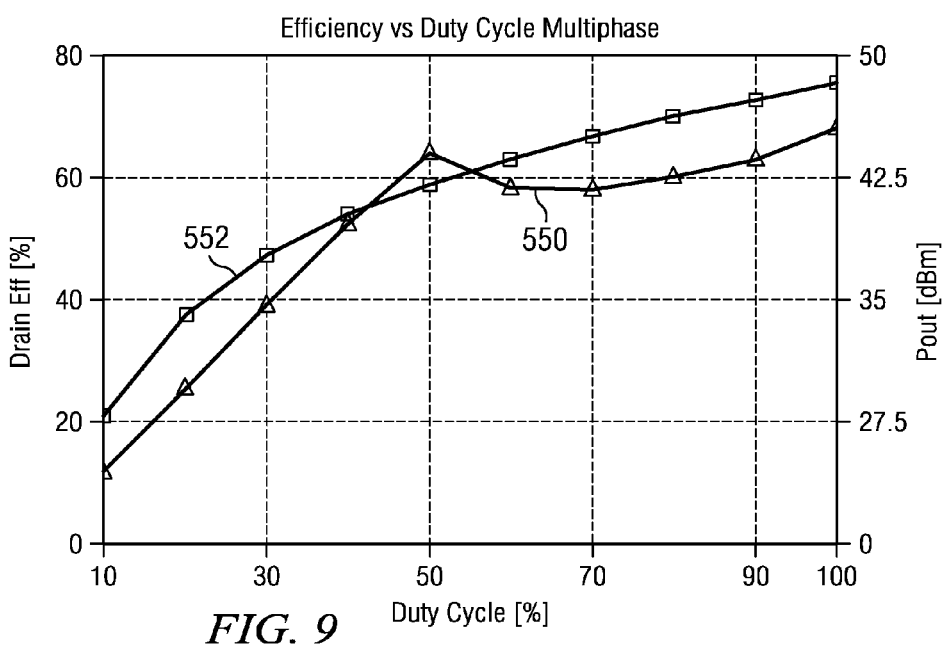
FIG. 9 illustrates a graph showing output power and efficiency with respect to duty cycle for an embodiment multi-level RF transmission system.

FIG. 9 illustrates a graph of overall efficiency 550 and output power 552 of the transmitter shown in FIG. 8 for an input signal whose amplitude is swept from zero to Umax (duty-cycle).

Figure 10:
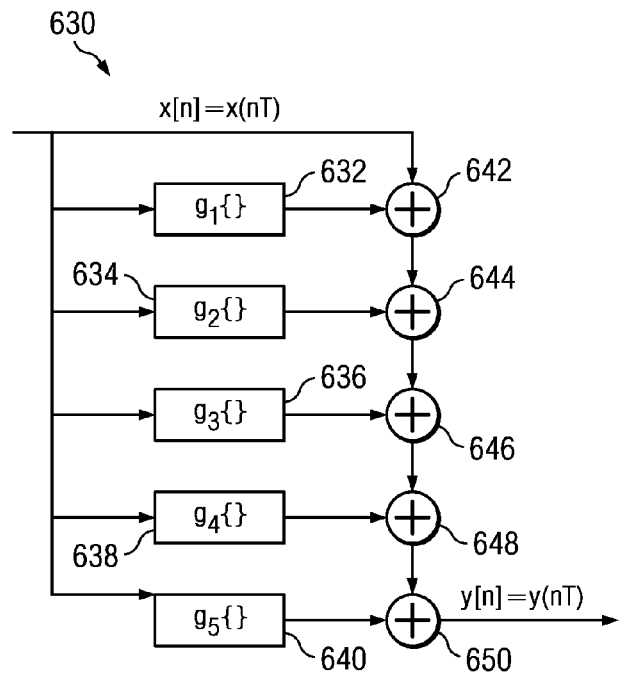
FIG. 10 illustrates an embodiment PWM modulator.

FIG. 10 illustrates an embodiment band limited function generator 630 for one basis function where k=5, meaning that the PWM signal is generated using the first 5 Fourier harmonics. Blocks 632, 634, 636, 638 and 640 generate functions $g_1\{\}$, $g_2\{\}$, $g_3\{\}$, $g_4\{\}$ and $g_5\{\}$, respectively. Input signal x(nT) is summed with the outputs of $g_1\{\}$, $g_2\{\}$, $g_3\{\}$, $g_4\{\}$ and $g_5\{\}$ using summing blocks 642, 644, 646, 648 and 650. It should be appreciated that in alternative embodiments, greater or fewer harmonics than five can be used. It should be further appreciated that function generator 630 shown in FIG. 10 is just one example of show band limited functions can be generated. In alternative embodiments, other functionally equivalent structures can be used. In an embodiment, each of the multiple basis functions may be implemented using function generator 630.

Figure 11:
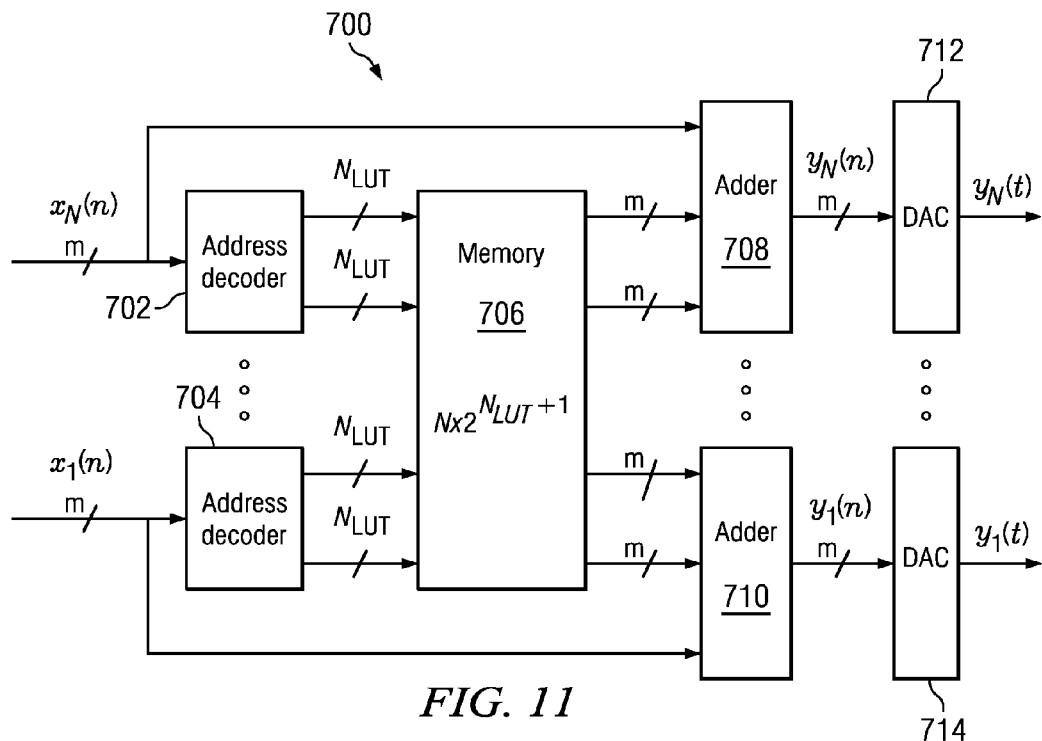
FIG. 11 illustrates an embodiment PWM modulator implementation.

FIG. 11 illustrates embodiment architecture 700 used to generate plurality of embodiment band limited functions. Here, memory 706 implements a lookup table in which basis functions $g_k\{\}$ are accessed using digital input signals $x_1(n)$ to $x_N(n)$ as an addresses. Address decoders 702 to 704 produce decoded address lines of width $N_{LUT}$ to memory 706, where N is the number of PWM levels. Adders 708 and 710 sums outputs of memory 706 to form digital output word $y_1(n)$ to $y_N(n)$. In one embodiment, digital output word y(n) is converted into the analog domain via digital-to-analog converters (DACs) 712 and 714 to form $y_1(t)$ to $y_N(t)$. In alternative embodiments, further processing, for example, a digital upconversion, is performed on digital output words $y_1(n)$ to $y_N(n)$ before performing a digital-to-analog conversion. In some embodiments, DACs 712 and 714 can be omitted.

In an embodiment, one address decoder, adder and DAC is included for each basis function. To generate an N-level PWM signal, N address decoders, N address and N DACs are implemented. The size of memory is, therefore, $N \times 2^{N_{LUR}+1}$. The width of the busses for $x_1(n)$ to $x_N(n)$ and $y_1(n)$ to $y_N(n)$ are m bits wide. In one embodiment, $m=8$, $N_{LUT}=5$, and $N=1$. Alternatively, other values may be used depending on the particular embodiment and its specifications.

In some embodiments, the band limitation of the PWM generator creates an approximation of an ideal PWM signal, which means that the signal contains not only temporal pulse-width information but also amplitude information. Therefore, a low resolution DAC is used to convert this multi-bit digital signal into the analog domain in some embodiments. Depending on the required signal quality or dynamic range for a particular implementation, a resolution of 8 to 10 bits for a 60 dB to 70 dB dynamic range is sufficient. Alternatively, greater or fewer than 8 or 10 bits can be used depending on the implementation and its specifications.

In an embodiment, a method of producing a multi-level RF signal includes producing plurality of pulse-width modulated signals based on an input signal; where each of the plurality of pulse-width modulated signals include an active state and an inactive state. The method also includes driving a corresponding plurality of parallel amplifiers with the plurality of pulse-width modulated signals, where driving includes setting a parallel amplifier to have a first output impedance when a corresponding pulse-width modulated signal is in the active state, and setting the parallel amplifier to have a second output impedance when the corresponding pulse-width is in the inactive state. The method further includes phase shifting the outputs of the plurality of parallel amplifiers combining the phase shifted outputs. In an embodiment, phase shifting transforms the second output impedance into a third impedance, where the third impedance is higher than the second impedance.

In an embodiment, combining the phase shifted outputs includes coupling the phase-shifted outputs to an isolation device, such as a circulator. In some embodiments, the isolation device decouples the PAs from a bandpass filter, or other circuit, coupled to an output of the isolation device. In some embodiments, setting the parallel amplifier to have the second output impedance includes coupling an output of the parallel amplifier to an RF short. In an embodiment, the phase shifting transforms the RF short to an RF open. Furthermore, producing the plurality of pulse-width modulated signals may include forming a multi-level pulse-width modulated signal. The method may also include upconverting the plurality of pulse-width modulated signals before driving the corresponding plurality of parallel amplifiers.

In an embodiment, producing the plurality of pulse-width modulated signals includes generating a first set of Fourier harmonics approximating a pulse-width modulated signal having a pulse-width proportional to a first digital input signal, and generating a second set of Fourier harmonics approximating a pulse-width modulated signal having a pulse-width proportional to a first digital input signal. The second set of Fourier harmonics is phase shifted from the first set of Fourier harmonics.

In an embodiment, the method further includes producing a first pulse-width modulated output signal based on the first set of Fourier harmonics, and producing a second pulse-width modulated output signal based on the second set of Fourier harmonics. Producing the first and second pulse-width modulated signals may include performing digital-to-analog conversions. In some embodiments, producing the plurality of pulse-width modulated signals includes calculating a finite number of first basis functions of a first pulse-width modulated signal based on the input signal, and forming a first electronic output signal based on the calculated finite number of first basis functions, where the first electronic output signal forms a first of the plurality of pulse-width modulated signals. Producing the plurality of pulse-width modulated signals also includes calculating a finite number of second basis functions of a second pulse-width modulated signal based on the input signal and forming a second electronic output signal based on the calculated finite number of second basis functions. The second basis functions are phase shifted from the first basis functions, and the second electronic output signal forms a second of the plurality of pulse-width modulated signals.

In an embodiment, a method of generating a multi-level pulse-width modulated signal includes calculating a finite number of first basis functions of a first pulse-width modulated signal based on an input signal, forming a first electronic output signal based on the calculated finite number of first basis functions, calculating a finite number of second basis functions of a second pulse-width modulated signal based on the input signal, and forming a second electronic output signal based on the calculated finite number of second basis functions. The second basis functions are phase shifted from the first basis functions.

In an embodiment, the method further includes driving a first output driver with the first electronic output signal, and driving a second output driver with the second electronic output signal. In some embodiments, the method further includes upconverting the first electronic output signal before driving the first output driver, and upconverting the second electronic output signal before driving the second output driver.

In an embodiment, driving the first and second output drivers includes configuring the first output driver to have a first impedance when the first electronic signal indicates an active state, configuring the first output driver to have a low impedance when the first electronic signal indicates an inactive state, configuring the second output driver to have a first impedance when the second electronic signal indicates and active state, configuring the second output driver to have a low impedance when the second electronic signal indicates an inactive state, phase shifting outputs of the first and second output drivers, and combining the phase shifted outputs of the first and second output drivers to form a multi-level RF signal. In an embodiment, the low impedance is transformed into a high impedance, and the high impedance is higher than the first impedance.

In an embodiment, a transmitter for a multi-level RF signal the transmitter includes a plurality of branches coupled to a common signal port. Each branch contains a driving circuit having an output that has a first output impedance when the driving circuit is active and a second output impedance when the driving circuit is inactive. Each branch also contains a phase shifter coupled between the output of the driving circuit and the common output port, and an isolation device such as a circulator having a first port coupled to the common signal port, a second port coupled to a termination, and an output port.

In an embodiment, the second output impedance is an RF short, and the phase shifter transforms the second impedance to a high impedance. In an embodiment, the phase shifter provides a phase shift of about 90 degrees. Furthermore, the phase shifter may have a third impedance. In an embodiment, the plurality of branches include N branches, and the third impedance is about $\sqrt{N-1}$ times the first impedance. In some embodiments, each driving circuit is configured to be selectively activated to form a multi-level signal at an output of the circulator or other isolation device.

In an embodiment, the driving circuit includes a power amplifier and a switch coupled to an output of the power amplifier, where the switch couples the output of the power amplifier to an RF ground when the power amplifier is in an inactive state.

In an embodiment, the transmitter also includes a modulator having a plurality of parallel outputs, where each of the plurality of parallel outputs is coupled to a corresponding input of the plurality of branches. In some embodiments, the modulator is configured to calculate a finite number of first basis functions of a first pulse-width modulated signal based on an input signal, and calculate a finite number of second basis functions of a second pulse-width modulated signal based on the input signal. A first electronic output signal based on the calculated finite number of first basis functions, and a second electronic output signal based on the calculated finite number of second basis functions is formed. The first electronic output signal forms a first of the plurality of parallel outputs, and the second electronic output signal forms a second of the plurality of parallel outputs. The second basis functions are phase shifted from the first basis functions.

In an embodiment, the modulator further comprises a digital pulse-width modulator and a digital-to-analog (D/A) converter block coupled to an output of the digital pulse-width modulator. The digital pulse-width modulator is configured to generate a first set of Fourier harmonics approximating a pulse-width modulated signal having a pulse-width proportional to a first digital input signal, and generate a second set of Fourier harmonics approximating a pulse-width modulated signal having a pulse-width proportional to a first digital input signal, where the second set of Fourier harmonics are phase shifted from the first set of Fourier harmonics. The D/A converter block is configured to produce a first output based on the first set of Fourier harmonics and a second output based on the second set of Fourier harmonics.

In an embodiment, the modulator is configured to generate a pulse-width modulated signal at each of the plurality of parallel outputs based on modulator input signal. In some embodiments, each of the branches further includes an upconverter coupled between a corresponding output of the modulator and an input of the driving circuit. In an embodiment, each phase shifter includes a 90 degree phase shifter, and each phase shifter has an impedance of about $\sqrt{2}$ times the first impedance. In some embodiments, the transmitter also includes a bandpass filter coupled to the output port of the circulator or other isolation device.

In an embodiment, a system for providing a multi-level pulse-width modulated signal includes a first and second digital pulse-width modulator. The first digital pulse-width modulator is configured to generate a first plurality of basis functions approximating a pulse-width modulated signal having a pulse-width proportional to a first digital input signal, and the second digital pulse-width modulator is configured to generate a second plurality of basis functions approximating a pulse-width modulated signal having a pulse-width proportional to the first digital input signal. The second plurality of basis functions are phase shifted with respect to the first plurality of basis functions.

In an embodiment, the first plurality of basis functions includes a first k Fourier Series harmonics of the pulse-width modulated signal. In an embodiment, these first k Fourier Series harmonics are calculated according to:

$$g_k\{\ \} = \frac{1}{k\pi}(\sin(2\pi k f_p nT) - \sin(2\pi k f_p nT - 2\pi k x(nT))),$$

where $g_k\{\ \}$ is a time domain representation of a kth basis function, fp is a pulse-width modulation frequency and x(nT) is the input signal. In an embodiment, the system also includes a digital-to-analog converter coupled to an output of the digital pulse-width modulator.

An advantage of embodiments include the ability to operate a multi-level PWM transmitter concept for highly efficient operation which can handle high signal bandwidths and receive bands close to the transmit band without severe interference from the transmit to the receive path.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of producing a multi-level RF signal, the method comprising:
   producing plurality of pulse-width modulated signals based on an input signal, each of the plurality of pulse-width modulated signals comprising an active state and an inactive state;
   driving a corresponding plurality of parallel amplifiers with the plurality of pulse-width modulated signals, driving comprising setting a parallel amplifier to have a first output impedance when a corresponding pulse-width modulated signal is in the active state and setting the parallel amplifier to have a second output impedance when the corresponding pulse-width is in the inactive state;
   phase shifting the outputs of the plurality of parallel amplifiers, wherein phase shifting transforms the second output impedance into a third impedance, the third impedance being higher than the second impedance; and
   combining the phase shifted outputs.

2. The method of claim 1, wherein combining the phase shifted outputs comprises coupling the phase shifted outputs to a first device that decouples the parallel amplifiers from a further circuit coupled to the first device.

3. The method of claim 2, wherein:
   the first device comprises a circulator; and
   the further device comprises a bandpass filter coupled to an output of the circulator.

4. The method of claim 1, wherein the setting the parallel amplifier to have the second output impedance comprises coupling an output of the parallel amplifier to an RF short.

5. The method of claim 1, wherein the phase shifting transforms the RF short to an RF open.

6. The method of claim 1, wherein producing the plurality of pulse-width modulated signals comprises forming a multi-level pulse-width modulated signal.

7. The method of claim 1, further comprising upconverting the plurality of pulse-width modulated signals before driving the corresponding plurality of parallel amplifiers.

8. The method of claim 1, wherein producing the plurality of pulse-width modulated signals comprises:

generating a first set of Fourier harmonics approximating a pulse-width modulated signal having a pulse-width proportional to a first digital input signal, and generating a second set of Fourier harmonics approximating a pulse-width modulated signal having a pulse-width proportional to a first digital input signal, the second set of Fourier harmonics being phase shifted from the first set of Fourier harmonics.

9. The method of claim 8, further comprising:
producing a first pulse-width modulated output signal based on the first set of Fourier harmonics; and
producing a second pulse-width modulated output signal based on the second set of Fourier harmonics.

10. The method of claim 9, wherein producing the first and second pulse-width modulated signals comprises performing digital-to-analog conversions.

11. The method of claim 1, wherein producing the plurality of pulse-width modulated signals comprises:
calculating a finite number of first basis functions of a first pulse-width modulated signal based on the input signal;
forming a first electronic output signal based on the calculated finite number of first basis functions, the first electronic output signal forming a first of the plurality of pulse-width modulated signals;
calculating a finite number of second basis functions of a second pulse-width modulated signal based on the input signal, the second basis functions being phase shifted from the first basis functions; and
forming a second electronic output signal based on the calculated finite number of second basis functions, the second electronic output signal forming a second of the plurality of pulse-width modulated signals.

12. A method of generating a multi-level pulse-width modulated signal, the method comprising:
calculating a finite number of first basis functions of a first pulse-width modulated signal based on an input signal, wherein the finite number of basis functions comprises a first k Fourier Series harmonics of the first pulse-width modulated signal;
forming a first electronic output signal based on the calculated finite number of first basis functions;
calculating a finite number of second basis functions of a second pulse-width modulated signal based on the input signal, the second basis functions being phase shifted from the first basis functions; and
forming a second electronic output signal based on the calculated finite number of second basis functions.

13. The method of claim 12, further comprising:
driving a first output driver with the first electronic output signal; and
driving a second output driver with the second electronic output signal.

14. A method of generating a multi-level pulse-width modulated signal, the method comprising:
calculating a finite number of first basis functions of a first pulse-width modulated signal based on an input signal;
forming a first electronic output signal based on the calculated finite number of first basis functions;
calculating a finite number of second basis functions of a second pulse-width modulated signal based on the input signal, the second basis functions being phase shifted from the first basis functions;
forming a second electronic output signal based on the calculated finite number of second basis functions;
driving a first output driver with the first electronic output signal;
driving a second output driver with the second electronic output signal;
upconverting the first electronic output signal before driving the first output driver; and
upconverting the second electronic output signal before driving the second output driver.

15. The method of claim 14, wherein driving the first and second output drivers comprises:
configuring the first output driver to have a first impedance when the first electronic signal indicates an active state;
configuring the first output driver to have a low impedance when the first electronic signal indicates an inactive state;
configuring the second output driver to have a first impedance when the second electronic signal indicates and active state;
configuring the second output driver to have a low impedance when the second electronic signal indicates an inactive state;
phase shifting outputs of the first and second output drivers, wherein the low impedance is transformed into a high impedance, the high impedance being higher than the first impedance; and
combining the phase shifted outputs of the first and second output drivers to form a multi-level RF signal.

16. A transmitter for a multi-level RF signal the transmitter comprising:
a plurality of branches coupled to a common signal port, each branch comprising:
a driving circuit comprising an output, the output having a first output impedance when the driving circuit is active and a second output impedance when the driving circuit is inactive;
a phase shifter coupled between the output of the driving circuit and the common signal port;
an isolation device comprising a first port coupled to the common signal port and an output port; and
a modulator having a plurality of parallel outputs, each of the plurality of parallel outputs coupled to a corresponding input of the plurality of branches, wherein the modulator is configured to generate a pulse-width modulated signal at each of the plurality of parallel outputs based on modulator input signal.

17. The transmitter of claim 16, wherein the isolation device comprises a circulator.

18. The transmitter of claim 16, wherein:
the second output impedance comprises an RF short; and
the phase shifter transforms the second impedance to a high impedance.

19. The transmitter of claim 16, wherein the phase shifter provides a phase shift of about 90 degrees.

20. A transmitter for a multi-level RF signal the transmitter comprising:
a plurality of branches coupled to a common signal port, each branch comprising:
a driving circuit comprising an output, the output having a first output impedance when the driving circuit is active and a second output impedance when the driving circuit is inactive;
a phase shifter coupled between the output of the driving circuit and the common signal port; and
an isolation device comprising a first port coupled to the common signal port and an output port, wherein the phase shifter comprises a third impedance, the plurality of branches comprise N branches, and the third impedance is about $\sqrt{N-1}$ times the first output impedance.

21. The transmitter of claim 16, wherein each driving circuit is configured to be selectively activated to form a multi-level signal at an output of the isolation device.

22. The transmitter of claim 16, wherein the driving circuit comprises:
- a power amplifier; and
- a switch coupled to an output of the power amplifier, the switch coupling the output of the power amplifier to an RF ground when the power amplifier is in an inactive state.

23. The transmitter of claim 16, wherein the modulator is configured to:
- calculate a finite number of first basis functions of a first pulse-width modulated signal based on an input signal;
- form a first electronic output signal based on the calculated finite number of first basis functions, the first electronic output signal forming a first of the plurality of parallel outputs;
- calculate a finite number of second basis functions of a second pulse-width modulated signal based on the input signal, the second basis functions being phase shifted from the first basis functions; and
- form a second electronic output signal based on the calculated finite number of second basis functions, the second electronic output signal forming a second of the plurality of parallel outputs.

24. The transmitter of claim 16, wherein the modulator comprises:
- a digital pulse-width modulator configured to
  - generate a first set of Fourier harmonics approximating a pulse-width modulated signal having a pulse-width proportional to a first digital input signal, and
  - generate a second set of Fourier harmonics approximating a pulse-width modulated signal having a pulse-width proportional to a first digital input signal, the second set of Fourier harmonics being phase shifted from the first set of Fourier harmonics; and
- a digital-to-analog (D/A) converter block coupled to an output of the digital pulse-width modulator, the D/A converter block configured to produce a first output based on the first set of Fourier harmonics and a second output based on the second set of Fourier harmonics.

25. A transmitter for a multi-level RF signal the transmitter comprising:
- a plurality of branches coupled to a common signal port, each branch comprising:
  - a driving circuit comprising an output, the output having a first output impedance when the driving circuit is active and a second output impedance when the driving circuit is inactive;
  - a phase shifter coupled between the output of the driving circuit and the common signal port;
- an isolation device comprising a first port coupled to the common signal port and an output port; and
- a modulator having a plurality of parallel outputs, each of the plurality of parallel outputs coupled to a corresponding input of the plurality of branches, wherein each of the branches further comprises an upconverter coupled between a corresponding output of the modulator and an input of the driving circuit.

26. The transmitter of claim 16, wherein:
each phase shifter comprises a 90 degree phase shifter; and
each phase shifter has an impedance of about $\sqrt{2}$ times the first impedance.

27. The transmitter of claim 16, further comprising a bandpass filter coupled to the output port of the isolation device.

28. A system for providing a multi-level pulse-width modulated signal, the system comprising:
- a first digital pulse-width modulator configured to generate a first plurality of basis functions approximating a pulse-width modulated signal have a pulse-width proportional to a first digital input signal, wherein the first plurality of basis functions comprises a first k Fourier Series harmonics of the pulse-width modulated signal; and
- a second digital pulse-width modulator configured to generate a second plurality of basis functions approximating a pulse-width modulated signal have a pulse-width proportional to the first digital input signal, wherein the second plurality of basis functions are phase shifted with respect to the first plurality of basis functions.

29. The system of claim 28, wherein the first k Fourier Series harmonics are calculated according to:

$$g_k\{\ \} = \frac{1}{k\pi}(\sin(2\pi k f_P nT) - \sin(2\pi k f_P nT - 2\pi k x(nT))),$$

where $g_k\{\ \}$ is a time domain representation of a $k^{th}$ basis function, $f_p$ is a pulse-width modulation frequency and $x(nT)$ is the input signal.

30. The system of claim 28, comprising a digital-to-analog converter coupled to an output of at least one of the first digital pulse-width modulator and the second digital pulse-width modulator.

31. The transmitter of claim 20, wherein N=2 and the third impedance is about $\sqrt{2}$ times the first output impedance.

32. The transmitter of claim 20, wherein each phase shifter comprises a 90 degree phase shifter.

* * * * *